United States Patent
Cheng et al.

(10) Patent No.: US 11,195,755 B2
(45) Date of Patent: Dec. 7, 2021

(54) FIELD EFFECT TRANSISTOR DEVICES WITH SELF-ALIGNED SOURCE/DRAIN CONTACTS AND GATE CONTACTS POSITIONED OVER ACTIVE TRANSISTORS

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Zhenxing Bi, Niskayuna, NY (US); Dexin Kong, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/860,835

(22) Filed: Apr. 28, 2020

(65) Prior Publication Data
US 2020/0258779 A1     Aug. 13, 2020

Related U.S. Application Data

(62) Division of application No. 16/181,914, filed on Nov. 6, 2018, now Pat. No. 10,707,127.

(51) Int. Cl.
*H01L 21/768*     (2006.01)
*H01L 23/522*     (2006.01)
(Continued)

(52) U.S. Cl.
CPC .. *H01L 21/76897* (2013.01); *H01L 21/76831* (2013.01); *H01L 21/76832* (2013.01);
(Continued)

(58) Field of Classification Search
CPC .......... H01L 21/76897; H01L 23/5226; H01L 21/76832; H01L 21/76831; H01L 29/785;
(Continued)

(56) References Cited

U.S. PATENT DOCUMENTS 6,235,593 B1   5/2001 Huang
9,147,576 B2   9/2015 Horak et al.
(Continued)

OTHER PUBLICATIONS

List of IBM Patents or Patent Applications Treated as Related dated Apr. 28, 2020, 2 pages.

*Primary Examiner* — Patricia D Reddington
(74) *Attorney, Agent, or Firm* — Tutunjian & Bitetto, P.C.; Erik Johnson

(57) ABSTRACT

A method of forming a transistor device is provided. The method includes forming a plurality of gate structures including a gate spacer and a gate electrode on a substrate, wherein the plurality of gate structures are separated from each other by a source/drain contact. The method further includes reducing the height of the gate electrodes to form gate troughs, and forming a gate liner on the gate electrodes and gate spacers. The method further includes forming a gate cap on the gate liner, and reducing the height of the source/drain contacts between the gate structures to form a source/drain trough. The method further includes forming a source/drain liner on the source/drain contacts and gate spacers, wherein the source/drain liner is selectively etchable relative to the gate liner, and forming a source/drain cap on the source/drain liner.

20 Claims, 10 Drawing Sheets

(51) Int. Cl.
  *H01L 21/311*  (2006.01)
  *H01L 29/78*  (2006.01)
  H01L 29/66  (2006.01)
  H01L 21/285  (2006.01)
  H01L 29/423  (2006.01)

(52) U.S. Cl.
  CPC .... *H01L 23/5226* (2013.01); *H01L 21/28518* (2013.01); *H01L 21/31111* (2013.01); *H01L 21/31122* (2013.01); *H01L 29/42372* (2013.01); *H01L 29/66545* (2013.01); *H01L 29/785* (2013.01)

(58) Field of Classification Search
  CPC ......... H01L 29/66545; H01L 21/31111; H01L 21/31122; H01L 21/76834; H01L 21/76883; H01L 21/823431; H01L 21/845; H01L 21/28518; H01L 29/42372
  See application file for complete search history.

(56) References Cited

U.S. PATENT DOCUMENTS

| | | |
|---|---|---|
| 9,461,143 B2 | 10/2016 | Pethe et al. |
| 9,691,897 B2 | 6/2017 | Xie et al. |
| 9,905,671 B2 | 2/2018 | Cheng et al. |
| 9,935,168 B2 | 4/2018 | Horak et al. |
| 9,941,278 B2 | 4/2018 | Labonte et al. |
| 2015/0364378 A1* | 12/2015 | Xie .................. H01L 21/76897 257/368 |
| 2017/0054004 A1 | 2/2017 | Cheng et al. |
| 2017/0125530 A1* | 5/2017 | Zhang ............... H01L 29/42372 |

\* cited by examiner

FIELD EFFECT TRANSISTOR DEVICES WITH SELF-ALIGNED SOURCE/DRAIN CONTACTS AND GATE CONTACTS POSITIONED OVER ACTIVE TRANSISTORS

BACKGROUND

Technical Field

The present invention generally relates to field effect transistor devices, and more particularly to gate and source/drain contact structures of field effect transistor devices.

Description of the Related Art

A Field Effect Transistor (FET) typically has a source, a channel, and a drain, where current flows from the source to the drain, and a gate that controls the flow of current through the device channel. Field Effect Transistors (FETs) can have a variety of different structures, for example, FETs have been fabricated with the source, channel, and drain formed in the substrate material itself, where the current flows horizontally (i.e., in the plane of the substrate), and FinFETs have been formed with the channel extending outward from the substrate, but where the current also flows horizontally from a source to a drain. The channel for the FinFET can be an upright slab of thin rectangular silicon (Si), commonly referred to as the fin with a gate on the fin, as compared to a MOSFET with a single gate parallel with the plane of the substrate. Depending on the doping of the source and drain, an n-FET or a p-FET can be formed. Two FETs also can be coupled to form a complementary metal oxide semiconductor (CMOS) device, where a p-channel MOSFET and n-channel MOSFET are electrically coupled together.

SUMMARY

In accordance with an embodiment of the present invention, a method of forming a transistor device is provided. The method includes forming a plurality of gate structures including a gate spacer and a gate electrode on a substrate, wherein the plurality of gate structures are separated from each other by a source/drain contact. The method further includes reducing the height of the gate electrodes to form gate troughs, and forming a gate liner on the gate electrodes and gate spacers. The method further includes forming a gate cap on the gate liner, and reducing the height of the source/drain contacts between the gate structures to form a source/drain trough. The method further includes forming a source/drain liner on the source/drain contacts and gate spacers, wherein the source/drain liner is selectively etchable relative to the gate liner, and forming a source/drain cap on the source/drain liner.

In accordance with another embodiment of the present invention, a method of forming a transistor device is provided. The method includes forming a plurality of gate structures including a gate spacer and a gate electrode on a substrate, wherein the plurality of gate structures are separated from each other by a source/drain contact. The method further includes reducing the height of the gate electrodes to form gate troughs, and forming a gate liner on the gate electrodes and gate spacers. The method further includes forming a gate cap on the gate liner, and reducing the height of the source/drain contacts between the gate structures to form a source/drain trough. The method further includes forming a source/drain liner on the source/drain contacts and gate spacers, wherein the source/drain liner is selectively etchable relative to the gate liner, and forming a source/drain cap on the source/drain liner. The method further includes forming a patterned lower mask layer on the source/drain caps and gate caps, wherein a source/drain trench exposes a portion of each of the source/drain caps in a staggered arrangement, and removing the exposed portions of the source/drain caps, and the underlying portions of the source/drain liners.

In accordance with yet another embodiment of the present invention, a transistor device is provided. The device includes at least three gate structures including a gate spacer and a gate electrode on a substrate, and a source/drain contact between each pair of the at least three gate structures. The device further includes a gate contact on the gate electrode, wherein at least a portion of the gate contact is on a portion of a source/drain cap, and a source/drain lead on each of the source/drain contacts, wherein a portion of the source/drain lead is on a portion of the gate spacer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention provide electrical connections to gate electrodes and source/drains positioned above the active transistor devices, rather than off-set to a side of the transistor devices, to reduce the footprint size of the transistor devices. A gate contact over an active (GCOA) enables an increase in transistor density on a chip because the gate contact is on top of the active region already occupied by the device, so does not require extra area on the chip. The placement of the gate contact over the active device(s) provides smaller cell sizes for memory and/or logic cells.

Embodiments of the present invention provide a method of fabricating electrical connections to gate electrodes and source/drains, where the electrical connections are positioned above the active transistor devices. Use of different liner and cap materials can provide greater etch selectivity and reduced electrical shorts between closely spaced conductive features. The use of different materials can reduce dielectric erosion during subsequent processing steps, so more insulator material remains between the closely spaced conductive features.

Embodiments of the present invention provide a method of overcoming finite etch selectivity among the different dielectric materials used for liners and caps on conductive features of the transistor devices. The use of metal oxides for liner and cap materials along with low-k spacer materials can provide sufficient etch selectivity to meet device requirements. Particularly, a low-k spacer is subjected to etching twice, once during a source/drain contact etch and another during a gate contact etch. Thinning/breaching/damaging of the low-k spacer can result in electrical shorts and/or reliability problem due to widely varying electrical characteristics of the devices.

In one or more embodiments, spacer erosion can be sufficiently reduced or eliminated to avoid electrical shorts without forming a dielectric cap over the gate spacer(s), and without recessing the source/drain contacts deeper than the top surface of the gate electrode(s), so the fabrication process complexity can be reduced.

Exemplary applications/uses to which the present invention can be applied include, but are not limited to: transistor device based memory cells (e.g., static random access memory (SRAM), dynamic random access memory (DRAM), latches, etc.), and transistor based logic cells (e.g., NAND gates, NOR gates, XOR gates, flip-flops, etc.). The transistors can be planar transistors, FinFETs, nanowire transistors, nanosheet transistors, stacked transistors, etc.

It is to be understood that aspects of the present invention will be described in terms of a given illustrative architecture; however, other architectures, structures, substrate materials and process features and steps can be varied within the scope of aspects of the present invention.

Figure 1:
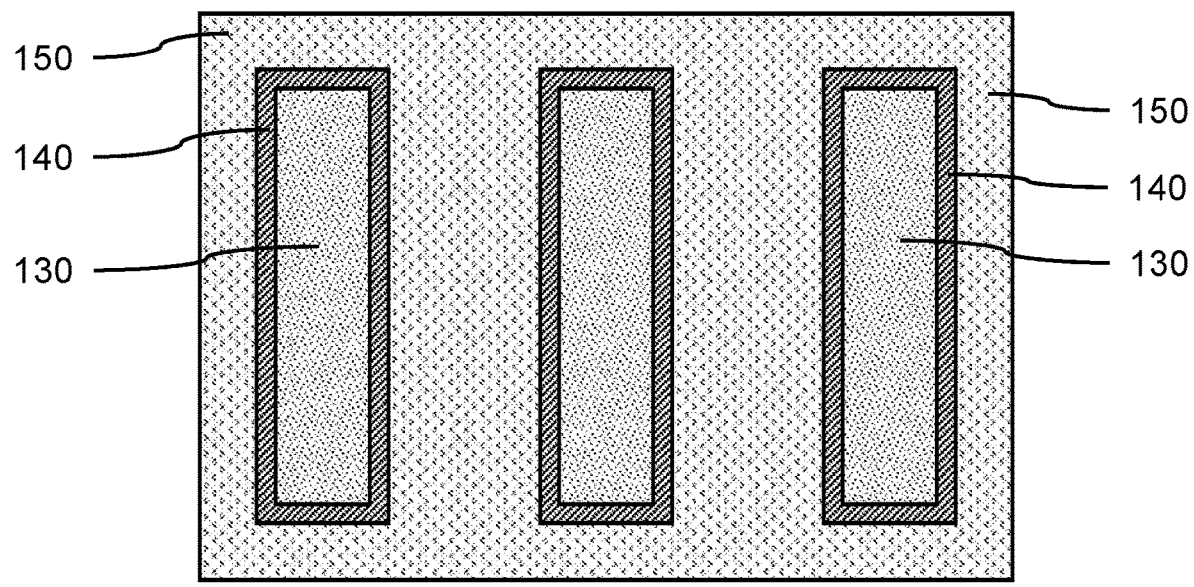
FIG. 1 is a top view showing a plurality of gate structures separated by an interlayer dielectric (ILD) material on source/drains and an active region of a substrate, in accordance with an embodiment of the present invention.

Referring now to the drawings in which like numerals represent the same or similar elements and initially to FIG. 1, a top view of a plurality of gate structures separated by an interlayer dielectric (ILD) material on source/drains and an active region of a substrate is shown, in accordance with an embodiment of the present invention.

In one or more embodiments, one or more gate structures can be formed on an active region of a substrate, where each of the gate structures can include a gate spacer 140 around a gate electrode 130. In various embodiments, the gate electrode 130 can be surrounded by the gate spacer on four sides. The gate electrodes(s) 130 can include a conductive gate fill, a work function layer, and a gate dielectric layer, where the gate dielectric layer can be formed on the device channel(s) and gate spacer(s), the work function layer can be formed on the gate dielectric layer, and the conductive gate fill can be formed on the work function layer. The gate structures can be formed by a combination of conformal and blanket depositions, where the gate dielectric layer and work function layer can be formed by conformal depositions, for example, atomic layer deposition (ALD) plasma enhanced ALD (PEALD), or low pressure chemical vapor deposition (LPCVD), and the conductive gate fill can be formed by a blanket deposition, for example, chemical vapor deposition (CVD) or plasma enhanced CVD (PECVD).

Patterning techniques such as lithography and etching can be used to form the gate structures. The gate structure can be formed by so-called "gate-first" process in which a gate is formed in the early stage of transistor fabrication and remains as the final transistor gate). Alternatively, the gate structure can be formed by so-called "replacement gate" process in which a dummy gate is first formed in the early stage of the transistor fabrication. The dummy gate is then removed and replaced by an active gate in the later processing. The replacement gate process can replace the entire dummy gate including gate dielectric and gate electrode, or it can just replace the gate electrode. The present figures describe a "gate-first" process, but a dummy gate could be used.

In various embodiments, the gate spacers 140 can be made of a silicon based dielectric material, including, but not limited to, silicon oxy boro carbon nitride (SiOBCN), silicon oxy carbo nitride (SiOCN), silicon boro carbonitride (SIBCN), silicon carbonitride (SiCN), silicon oxynitride (SiON), and combinations thereof.

In various embodiments, the active region of the substrate can be a vertical fin formed on a substrate or a region of the substrate acting as a device channel.

In one or more embodiments, an interlayer dielectric (ILD) material 150 can be blanket deposited on a substrate, so the interlayer dielectric (ILD) material 150 can fill in the spaces between the gate structures. In various embodiments, the interlayer dielectric (ILD) material 150 can be, for example, silicon oxide (SiO), silicon nitride (SiN), a low-k dielectric material, or any suitable combination of these materials. A low-k dielectric material can include, but not be limited to, carbon doped silicon oxide (SiO:C), fluorine doped silicon oxide (SiO:F), polymeric material, for example, tetraethyl orthosilicate (TEOS), hydrogen silsesquioxane (HSQ), methylsilsesquioxane (MSQ), silicon carbide (SiC), silicon oxynitride (SiON), silicon-carbon-nitride (SiCN), boron nitride (BN), silicon boron nitride (SiBN), silicon boron carbonitride (SiBCN), silicon oxycabonitride (SiOCN), and combinations thereof.

Figure 2:
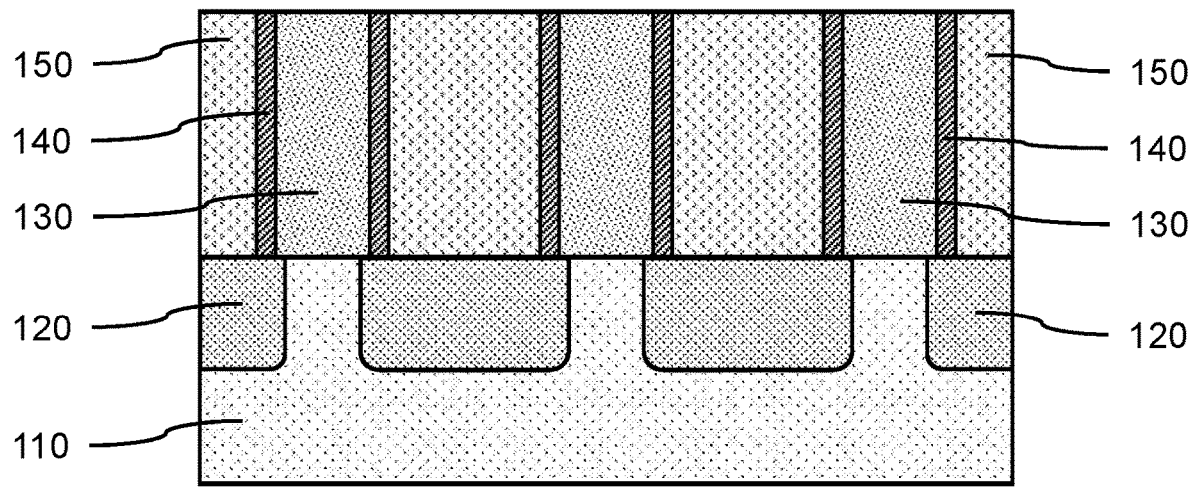
FIG. 2 is a cross-sectional side view showing a plurality of gate structures separated by an interlayer dielectric (ILD) material on source/drains and an active region of a substrate, in accordance with an embodiment of the present invention.

FIG. 2 is a cross-sectional side view showing a plurality of gate structures separated by an interlayer dielectric (ILD) material on source/drains and an active region of a substrate, in accordance with an embodiment of the present invention.

In one or more embodiments, a substrate 110 can be, for example, a single crystal semiconductor material wafer or a semiconductor-on-insulator stacked wafer. The substrate 110 can include a support layer that provides structural support, and an active semiconductor layer that can form devices, for example, vertical fins and/or MOSFET device channels. An insulating layer (e.g., a buried oxide (BOX) layer) may be between the active semiconductor layer and the support layer to form a semiconductor-on-insulator substrate (SeOI) (e.g., a silicon-on-insulator substrate (SOI)).

In one or more embodiments, the substrate 110 or an active semiconductor layer can be a crystalline semiconductor, for example, a IV or IV-IV semiconductor (e.g., silicon (Si), silicon carbide (SiC), silicon-germanium (SiGe), germanium (Ge)) or a III-V semiconductor (e.g., gallium-arsenide (GaAs), indium-phosphide (InP), indium-antimonide (InSb)). In various embodiments, the substrate 110 can be a single crystal wafer.

In one or more embodiments, the active region can include one or more vertical fins or metal-oxide-semiconductor field effect transistor (MOSFET) device channels formed on the substrate 110. The vertical fins can be formed by a multiple patterning fabrication process, for example, a sidewall image transfer (SIT) process, a self-aligned double patterning (SADP) process, self-aligned triple patterning (SATP) process, or a self-aligned quadruple patterning (SAQP). The vertical fins may be formed by a direct write process or double patterning process using, for example, immersion lithography, extreme ultraviolet lithography, or x-ray lithography. The fin templates can be formed on the vertical fins, as part of the patterning process. The MOSFET device channels can be formed between source/drains formed in the active region of the substrate. The transistors can be planar transistors, FinFETs, nanowire transistors, nanosheet transistors, stacked transistors, etc.

In one or more embodiments, source/drains 120 can be formed at the surface of the substrate 110, or on the vertical fins of the active region, where the source/drains 120 can be formed for example, by implantation and/or an epitaxial or heteroepitaxial growth process, for example, solid phase epitaxy (SPE), molecular beam epitaxy (MBE), liquid phase epitaxy (LPE), or gas phase epitaxy (GPE). The source/drains 120 can be doped to be an n-type source/drains or a p-type source/drains, where the dopant(s) can be introduced in situ (i.e., during formation of a layer) or ex situ (i.e., after formation of a layer). In various embodiments, n-type dopants can be, for example, phosphorus (P) or arsenic (As), and p-type dopants can be, for example, boron (B) or gallium (Ga). In various embodiments, the source/drains 120 can be a semiconductor material, including, but not limited to n-type (e.g., P or As) doped silicon (Si) or p-type (e.g., B) doped silicon-germanium (SiGe). In some embodiments, the source/drain material can further comprise carbon. The source/drains 120 can be the same semiconductor material as the substrate 110 or a different material.

In various embodiments, the gate dielectric layer can be in physical contact with the top surface of the active region of the substrate 110, for example, a section of the substrate between two source/drains 120 forming a device channel, or on a segment of a vertical fin.

In various embodiments, the gate electrodes(s) 130 can have a height in a range of about 15 nanometers (nm) to about 100 nm, or about 25 nm to about 40 nm, although other heights are also contemplated.

Figure 3:
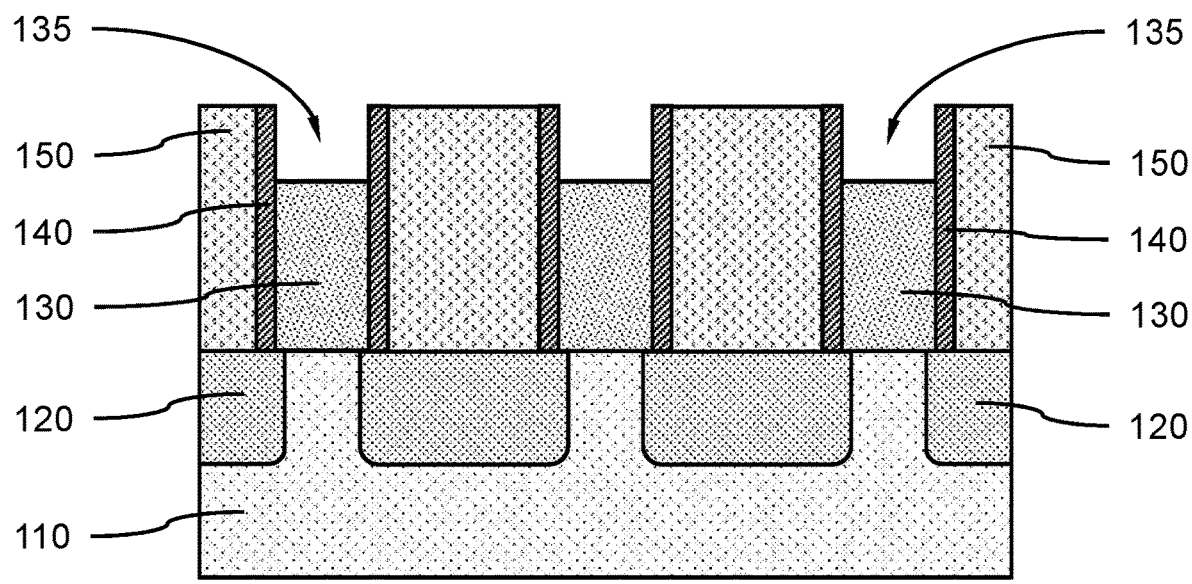
FIG. 3 is a cross-sectional side view showing the gate electrodes of the plurality of gate structures reduced in height to form gate troughs, in accordance with an embodiment of the present invention.

FIG. 3 is a cross-sectional side view showing the gate electrodes of the plurality of gate structures reduced in height to form gate troughs, in accordance with an embodiment of the present invention.

In one or more embodiments, the heights of the gate electrodes 130 of the gate structures can be reduced in height to form gate troughs 135, where portions of the conductive gate fill and work function layer can be removed using a directional etch (e.g., reactive ion etch (RIE)) and/or isotropic etch (e.g., wet chemical etch, dry plasma etch). In some embodiments, portions of the gate dielectric layer, when present on the sidewalls of the spacers, can also be removed.

In various embodiments, the gate troughs 135 can have a depth in a range of about 15 nanometers (nm) to about 60 nm, or about 20 nm to about 40 nm, although other depths are also contemplated. The depth of gate troughs 135 can be less than half the height of the gate electrodes.

Figure 4:
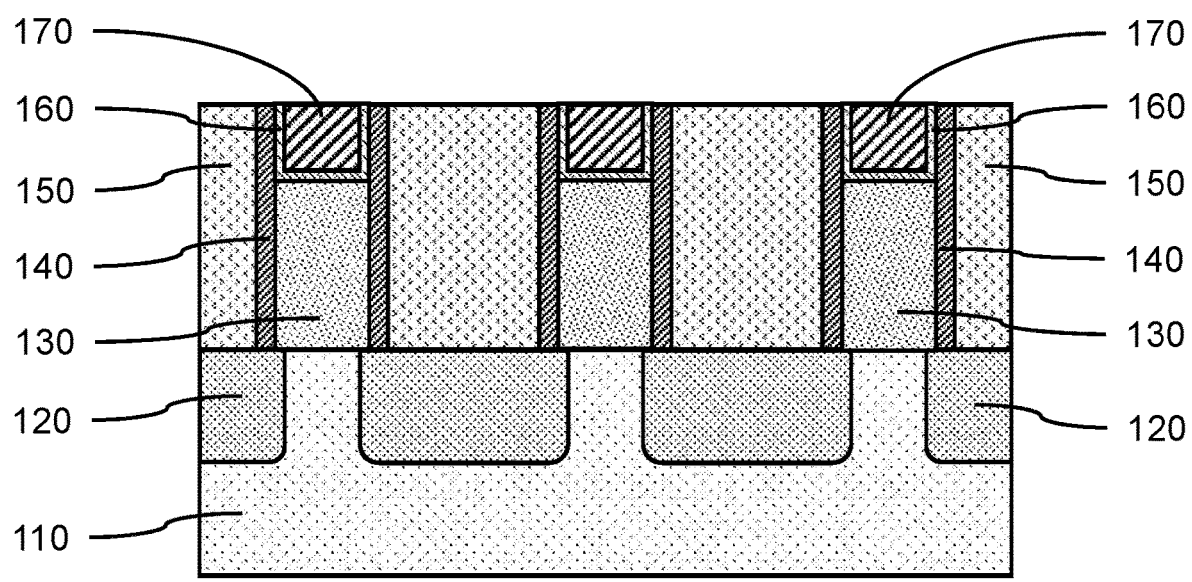
FIG. 4 is a cross-sectional side view showing a gate liner and a gate cap formed in each of the gate troughs on the gate electrodes, in accordance with an embodiment of the present invention.

FIG. 4 is a cross-sectional side view showing a gate liner and a gate cap formed in each of the gate troughs on the gate electrodes, in accordance with an embodiment of the present invention.

In one or more embodiments, a gate liner 160 can be formed in the gate trough 135, where the gate liner 160 can be formed by a conformal deposition (e.g., ALD, PEALD, LPCVD).

In various embodiments, the gate liner 160 can be made of aluminum oxide (AlO), transition metal oxides, for example, hafnium oxide (HfO), zirconium oxide (ZrO), hafnium zirconium oxide (HfZrO), titanium oxide (TiO), tantalum oxide (TaO), niobium oxide (NbO), and combinations thereof.

In various embodiments, the gate liner 160 can have a thickness in a range of about 2 nm to about 4 nm, or about 3 nm, although other thicknesses are also contemplated. In various embodiments, the gate liner 160 can be a bilayer, where two separate layers of different materials are formed on each other, with each layer having a thickness of about 2 nm.

In one or more embodiments, a gate cap 170 can be formed on the gate liner 160, where the gate cap 170 can be formed by a blanket, conformal, or directional deposition (e.g., ALD, PEALD, CVD, PECVD, high density plasma deposition (HDP), and/or physical vapor deposition (PVD)), to fill in the remaining portion of the gate trough 135, and excess material can be removed using a chemical-mechanical polishing (CMP). The top surfaces of the gate cap 170 and gate liner 160 can be approximately coplanar with the top surfaces of the gate spacers 140 and ILD material 150.

In various embodiments, the gate cap 170 can be a hardmask material, including, but not limited to, silicon nitride (SiN), silicon oxynitride (SiON), silicon carbide (SiC), silicon carbonitride (SiCN), silicon boronitride (SiBN), silicon borocarbide (SiBC), silicon boro carbonitride (SiBCN), or combinations thereof.

Figure 5:
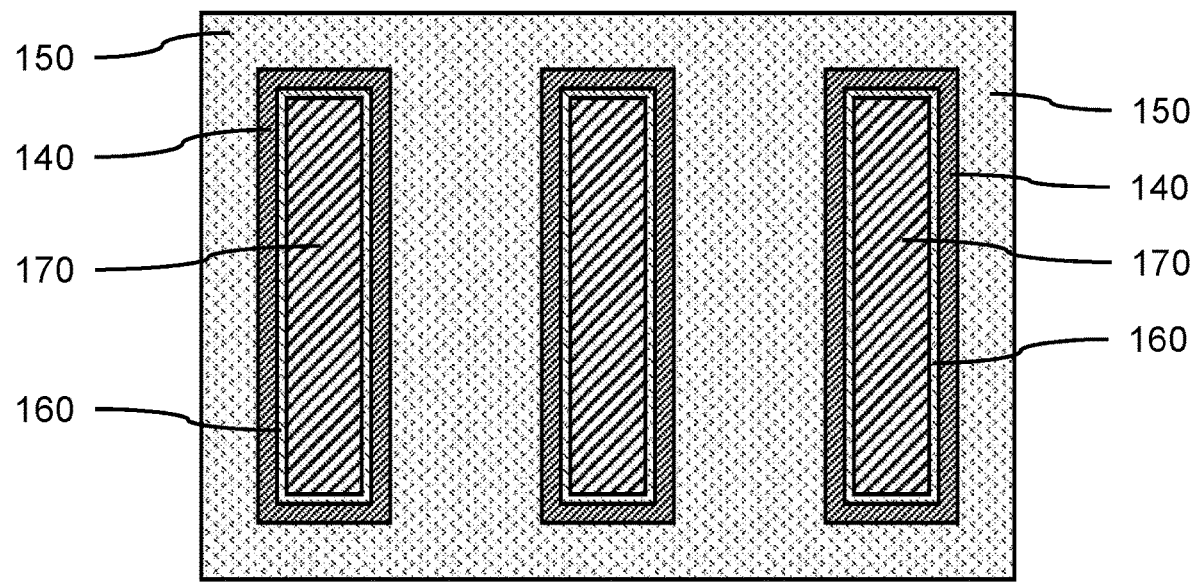
FIG. 5 is a top view showing the gate liner and a gate cap formed within the gate spacers of the gate structures, in accordance with an embodiment of the present invention.

FIG. 5 is a top view showing the gate liner and a gate cap formed within the gate spacers of the gate structures, in accordance with an embodiment of the present invention.

In one or more embodiments, the gate liner 160 can be on five sides of the gate cap 170, where the gate liner can be on the top surface of the gate electrode, including the gate dielectric layer, work function layer, and conductive gate fill. The gate spacer 140 can be around the gate liner 160 and gate cap 170.

Figure 6:
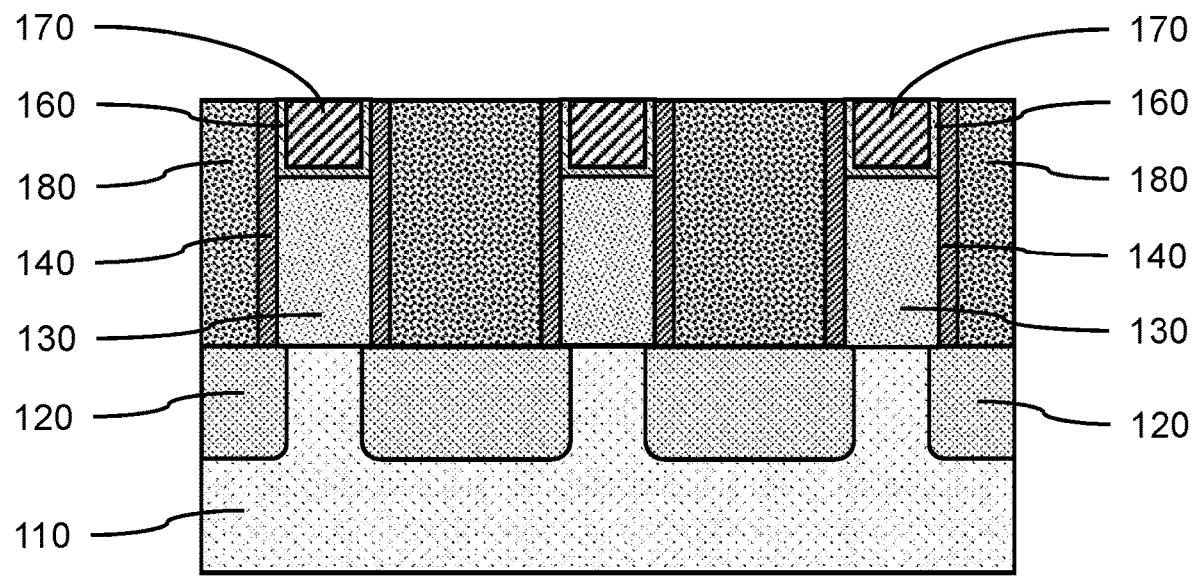
FIG. 6 is a cross-sectional side view showing the ILD material removed from between each of the gate structures and replaced with a conductive source/drain contact, in accordance with an embodiment of the present invention.

FIG. 6 is a cross-sectional side view showing the ILD material removed from between each of the gate structures and replaced with a conductive source/drain contact, in accordance with an embodiment of the present invention.

In one or more embodiments, portions of the ILD material 150 and gate caps 170, gate liners 160, and gate spacers 140 can be masked using a lithographic mask layer that exposes portions of the ILD material 150 between the gate spacers 140 of the gate structures. In various embodiments, the exposed portions of the ILD material 150 can be removed using a directional etch, isotropic etch, or a combination thereof to expose the underlying source/drain(s) 120.

In one or more embodiments, a conductive source/drain contact 180 can be formed in the space left open by removing the ILD material 150, where the conductive source/drain contact 180 can be formed by a blanket deposition, and excess material removed using a CMP. The conductive source/drain contact 180 can be in physical and electrical contact with the underlying source/drain 120. A long dimension of conductive source/drain contacts 180 can be less than the gate structures.

In various embodiments, the conductive source/drain contact 180 can be a conductive metal, including, but not limited to, tungsten (W), aluminum (Al), copper (Cu), cobalt (Co), nickel (Ni), titanium (Ti), ruthenium (Ru), molybdenum (Mo), or any other suitable conductive material. The contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of the conductive metal contact fill material with the top source drain material, and/or anode/cathode material. In various embodiments, the barrier layer can be deposited in the trench(es) by ALD, CVD, metal-organic CVD (MOCVD), PECVD, or combinations thereof. In various embodiments, the metal fill can be formed by ALD, CVD, and/or PVD to form the conductive source/drain contact 180.

Figure 7:
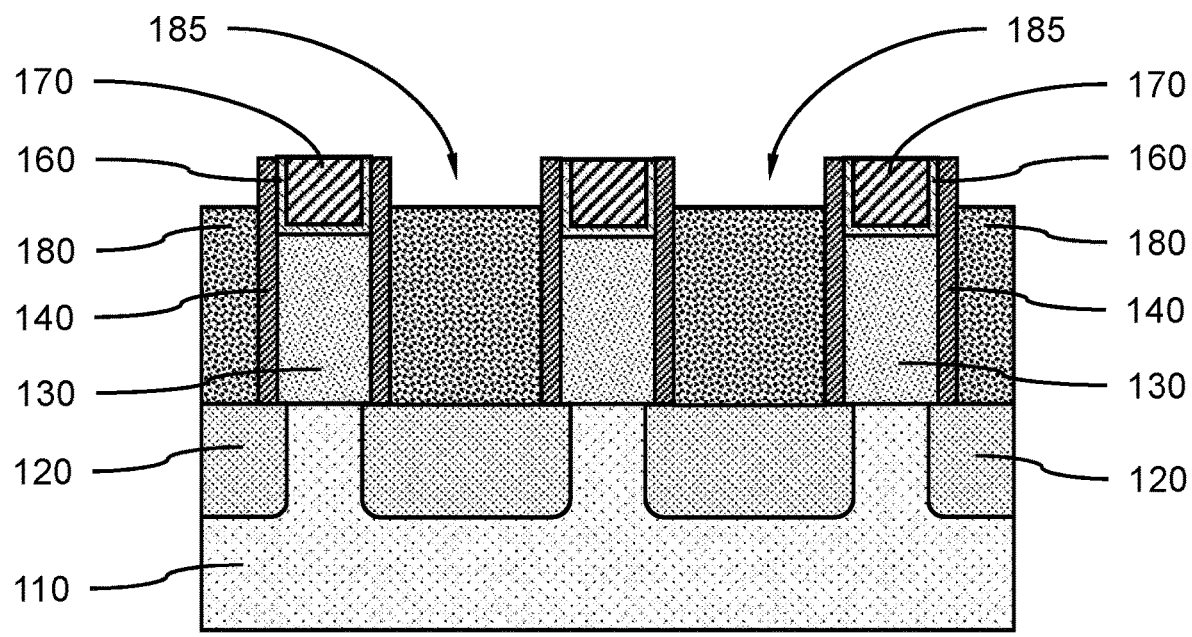
FIG. 7 is a cross-sectional side view showing the conductive source/drain contacts reduced in height to form source/drain troughs, in accordance with an embodiment of the present invention.

FIG. 7 is a cross-sectional side view showing the conductive source/drain contacts reduced in height to form source/drain troughs, in accordance with an embodiment of the present invention.

In one or more embodiments, the height of the conductive source/drain contact 180 can be reduced to form source/drain troughs 185, where a portion of the conductive source/drain contact 180 can be removed using a directional etch (e.g., reactive ion etch (RIE)) and/or isotropic etch (e.g., wet chemical etch, dry plasma etch).

In various embodiments, the depth of the source/drain troughs 185 can have a depth in a range of about 10 nm to about 40 nm, or about 20 nm to about 30 nm, although other depths are also contemplated. The depth of the source/drain troughs 185 can be less than the depth of the gate troughs 135, or about the same as the gate troughs 135. In various embodiments, the top surfaces of the reduced height conductive source/drain contact 180 can be above the bottom surface of the adjacent gate caps 170.

Figure 8:
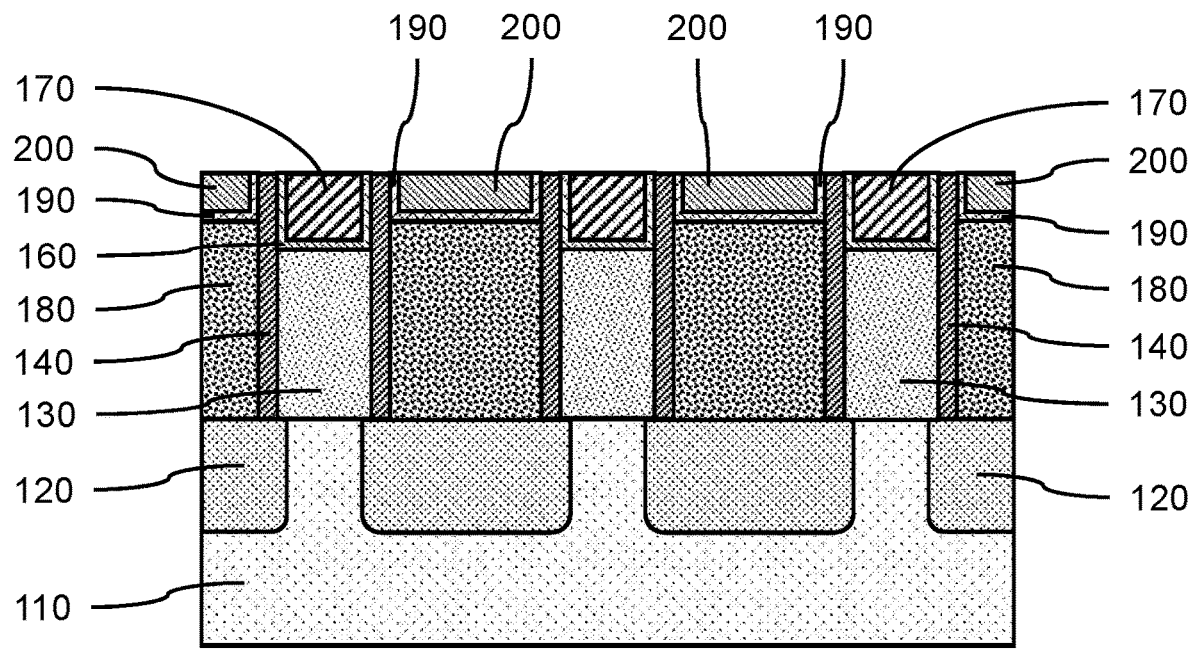
FIG. 8 is a cross-sectional side view showing a source/drain liner and a source/drain cap formed in each of the source/drain troughs on the conductive source/drain contacts, in accordance with an embodiment of the present invention.

FIG. 8 is a cross-sectional side view showing a source/drain liner and a source/drain cap formed in each of the source/drain troughs on the conductive source/drain contacts, in accordance with an embodiment of the present invention.

In one or more embodiments, a source/drain liner 190 can be formed in each of the source/drain troughs 185, where the source/drain liner 190 can be formed by a conformal deposition (e.g., ALD, PEALD, LPCVD). The source/drain liner 190 can be formed on the sidewalls of the gate spacers 140 and the top surface of the conductive source/drain contact 180.

In various embodiments, the source/drain liner 190 can have a thickness in a range of about 2 nm to about 4 nm, or about 3 nm, although other thicknesses are also contemplated. In various embodiments, the gate liner 160 can be a bilayer, where two separate layers of different materials are formed on each other, with each layer having a thickness of about 2 nm.

In various embodiments, the source/drain liner 190 can be aluminum oxide (AlO), transition metal binary oxides, for example, hafnium oxide (HfO), zirconium oxide (ZrO), hafnium zirconium oxide (HfZrO), titanium oxide (TiO), tantalum oxide (TaO), niobium oxide (NbO), and combinations thereof, where the source/drain liner 190 can be a different material from the gate liners 160, so the source/drain liner 190 can be selectively removed.

In one or more embodiments, a source/drain cap 200 can be formed on the source/drain liner 190, where the source/drain cap 200 can be formed by a blanket deposition (e.g., ALD, CVD, PECVD, HDP, PVD), to fill in the remaining portion of the source/drain trough 185, and excess material can be removed using a chemical-mechanical polishing (CMP). The top surfaces of the source/drain cap 200 and source/drain liner 190 can be approximately coplanar with the top surfaces of the gate cap 170, gate liner 160, gate spacers 140 and ILD material 150.

In various embodiments, the source/drain cap 200 can be a hardmask material, including, but not limited to, silicon nitride (SiN), silicon oxynitride (SiON), silicon carbide (SiC), silicon carbonitride (SiCN), silicon boronitride (SiBN), silicon borocarbide (SiBC), silicon boro carbonitride (SiBCN), or combinations thereof. In various embodiments, the source/drain cap 200 can be a different hardmask material from the gate cap 170, so the source/drain cap 200 can be selectively removed.

In a non-limiting exemplary embodiments, the gate liner 160 can be hafnium oxide (HfO), the gate cap 170 can be silicon nitride (SiN), the source/drain liner 190 can be aluminum oxide (AlO), and the source/drain cap 200 can be silicon carbide (SiC), so selective removal of the source/drain cap 200 and source/drain liner 190 reduces the amount of erosion of the gate cap 170.

Figure 9:
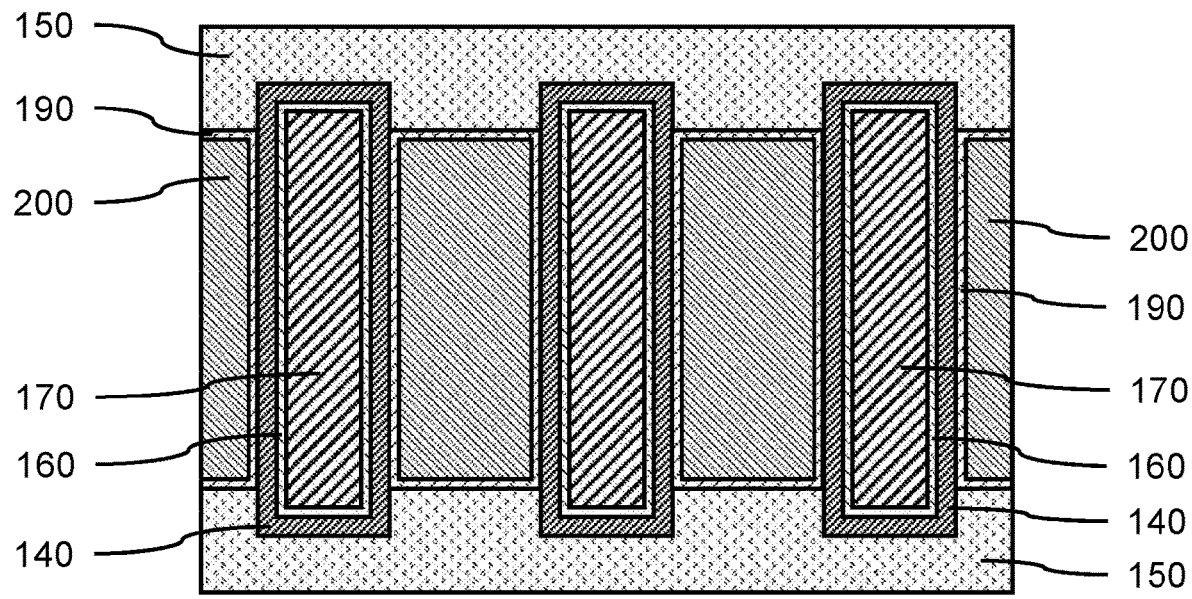
FIG. 9 is a top view showing the source/drain liner and source/drain cap formed between the gate spacers of the gate structures, in accordance with an embodiment of the present invention.

FIG. 9 is a top view showing the source/drain liner and source/drain cap formed between the gate spacers of the gate structures, in accordance with an embodiment of the present invention.

In one or more embodiments, the source/drain liners 190 and source/drain caps 200 are formed between the gate spacers 140 of the gate structures, where the source/drain liners 190 and source/drain caps 200 may not extend to the end walls of the gate spacers 140.

In one or more embodiments, the source/drain liner 190 can be on five sides of the source/drain cap 200, where the source/drain liner 190 can be on the top surface of the conductive source/drain contact 180. The gate spacer 140 can be on opposite sides of the source/drain liner 190 and source/drain cap 200. The ILD material 150 can be on opposite sides of the source/drain liner.

Figure 10:
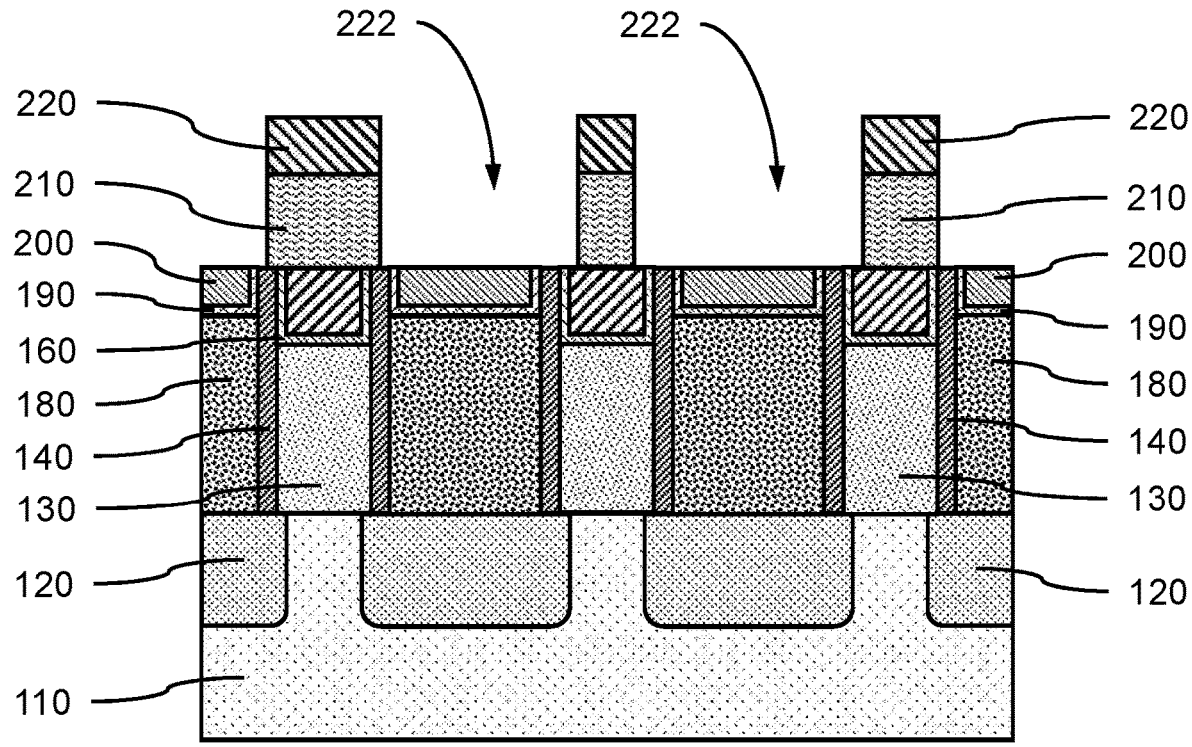
FIG. 10 is a cross-sectional side view showing a patterned lower mask layer on the portions of the gate spacers, gate liners, and gate caps, and a patterned upper mask layer on the lower mask layer forming source/drain trenches, in accordance with an embodiment of the present invention.

FIG. 10 is a cross-sectional side view showing a patterned lower mask layer on the portions of the gate spacers, gate liners, and gate caps, and a patterned upper mask layer on the lower mask layer forming source/drain trenches, in accordance with an embodiment of the present invention.

In one or more embodiments, a lower mask layer 210 can be formed on the portions of the gate spacers 140, gate liners 160, and gate caps 170, source/drain liners 190, and source/drain caps 200. An upper mask layer 220 can be formed on the lower mask layer 210.

In various embodiments, the lower mask layer 210 can be a hardmask material (e.g., silicon oxide (SiO)) that is blanket deposited on the exposed surfaces, and the upper mask layer 220 can be a lithographic resist material or a stack of lithographic materials such as organic planarization layer (OPL), anti-reflection coating (ARC), and photoresist layer. The upper mask layer 220 can be patterned using lithographic techniques and etching, and exposed portion of the lower mask layer 210 can be removed using a selective directional etch (e.g., RIE) to form source/drain trenches 222, where the source/drain trenches 222 can be positioned to expose at least portions of the source/drain liner 190 and source/drain cap 200, and may expose portions of the gate spacers 140, gate liners 160, and gate caps 170. The source/drain trenches 222 do not need to be precisely placed over the source/drain liner 190 and source/drain cap 200 because the etch selectivity of the gate liners 160 and gate caps 170 can protect the conductive source/drain contact 180 during a removal process. The source/drain trenches 222 can be wider than the source/drain liners 190 and source/drain caps.

Figure 11:
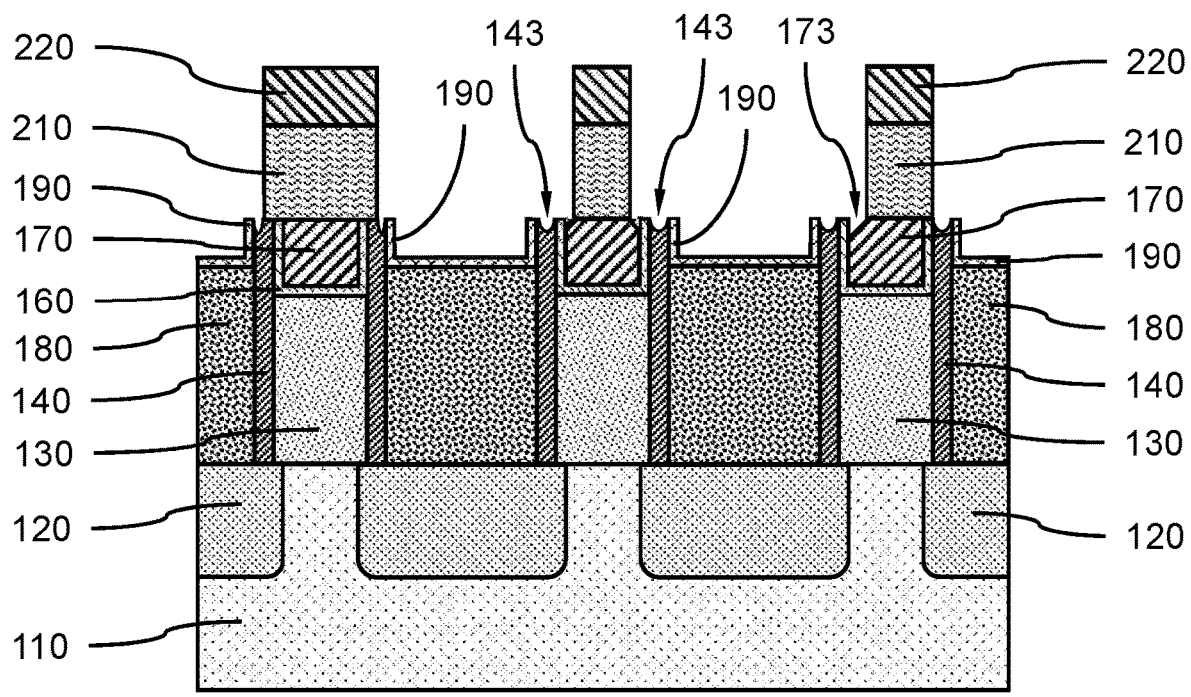
FIG. 11 is a cross-sectional side view showing the exposed source/drain caps removed from the source/drain liners, in accordance with an embodiment of the present invention.

FIG. 11 is a cross-sectional side view showing the exposed source/drain caps removed from the source/drain liners, in accordance with an embodiment of the present invention.

In one or more embodiments, the exposed source/drain caps 200 can be removed from within the source/drain liners 190 to expose the underlying source/drain liners 190. In various embodiments, the source/drain caps 200 can be removed using a selective directional etch (e.g., RIE) or a selective isotropic etch (e.g., wet chemical etch, dry plasma), where during the etch a portion of exposed gate spacers may be removed to form spacer dimples 143, and a portion of exposed gate caps 170 may be removed to form cap recesses 173. In various embodiments, the source/drain caps 200 can be removed selective to the source/drain liners 190 and gate liner 160.

In various embodiments, the gate liner 160 and source/drain liner 190 can remain after removing the source/drain cap 200. In various embodiments, the exposed portions of the gate spacers 140 can experience a concave dimpling due to partial erosion of the gate spacer material during selective etching, where upper portions of the sidewalls of the gate spacers 140 are protected by the gate liner 160 and the source/drain liner 190. The source/drain liner 190 can protect the conductive source/drain contact 180.

Figure 12:
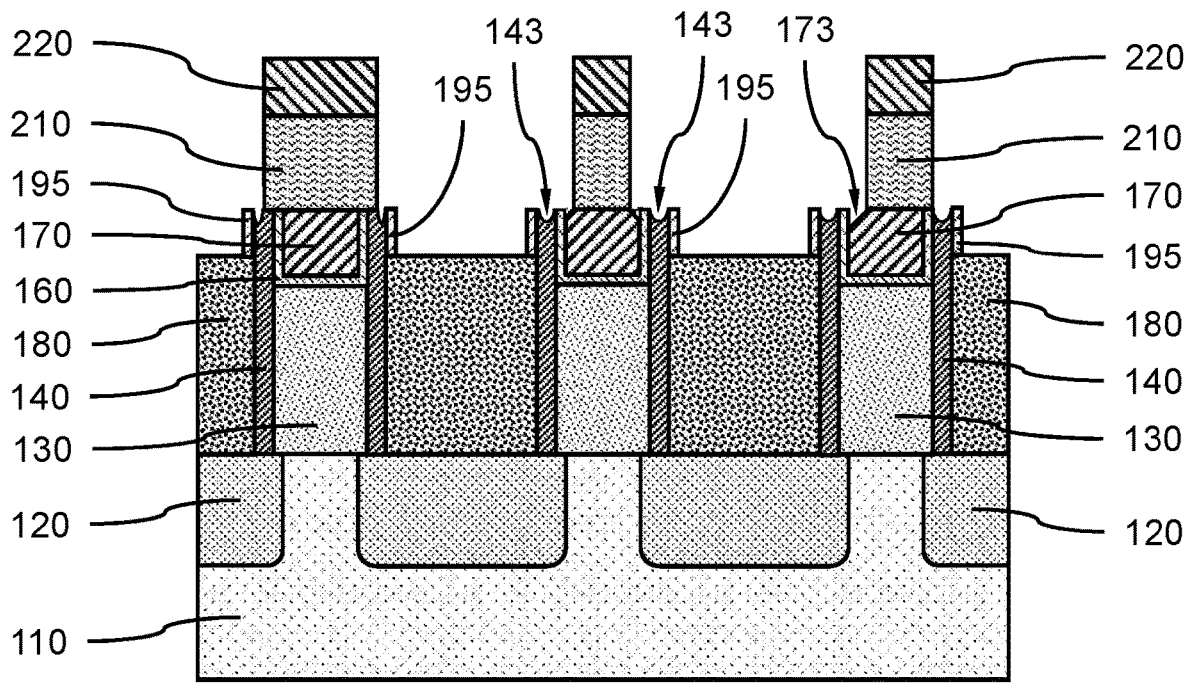
FIG. 12 is a cross-sectional side view showing exposed portions of the source/drain liners removed to form source/drain buffers that expose portions of the conductive source/drain contacts, in accordance with an embodiment of the present invention.

FIG. 12 is a cross-sectional side view showing exposed portions of the source/drain liners removed to form source/drain buffers that expose portions of the conductive source/drain contacts, in accordance with an embodiment of the present invention.

In one or more embodiments, a portion of the source/drain liners 190 on the conductive source/drain contacts 180 can be removed using a selective, directional etch (e.g., RIE) to expose the top surface of the conductive source/drain contacts 180, and leave a source/drain buffer 195 on each of the sidewalls of the opposite gate spacers 140. The endwalls of the source/drain liners 190 adjoining the ILD material 150 may not be exposed by the source/drain trenches 222, so that portion of the source/drain liners 190 may not be etched, and the unexposed portions of the source/drain liners 190 can remain.

In one or more embodiments, a portion of the source/drain liners 190 on the conductive source/drain contacts 180 can be removed using a selective, isotropic etch (e.g., wet etch ultra dilute hydrofluoric acid (HF), or dry plasma sulfur hexafluoride ($SF_6$)) to remove all of the exposed source/drain liners 190, and expose the top surface of the conductive source/drain contacts 180 and portions of the sidewalls of the gate spacers 140. Etch processes can be selective for liner material.

Figure 13:
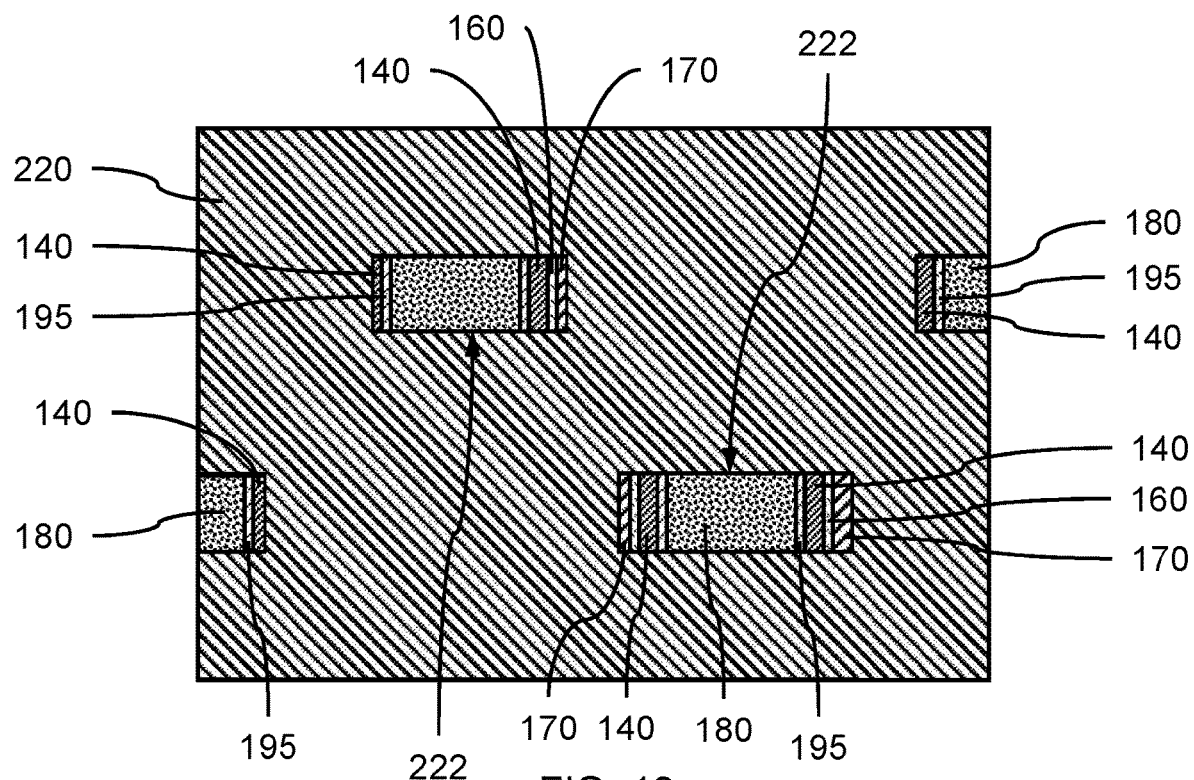
FIG. 13 is a top view showing the portions of the conductive source/drain contacts, source/drain buffer and gate spacers exposed by the source/drain trenches, in accordance with an embodiment of the present invention.

FIG. 13 is a top view showing the portions of the conductive source/drain contacts, source/drain buffer and gate spacers exposed by the source/drain trenches, in accordance with an embodiment of the present invention.

In various embodiments, the source/drain trenches 222 formed over portions of adjacent source/drain caps 200 can be staggered, so the source/drain trenches 222 are not on directly opposite sides of gate caps 170. The source/drain trenches 222 can have different sizes, and different portions of the gate spacers 140 and gate liners 160 may be exposed by each of the source/drain trenches 222.

Figure 14:
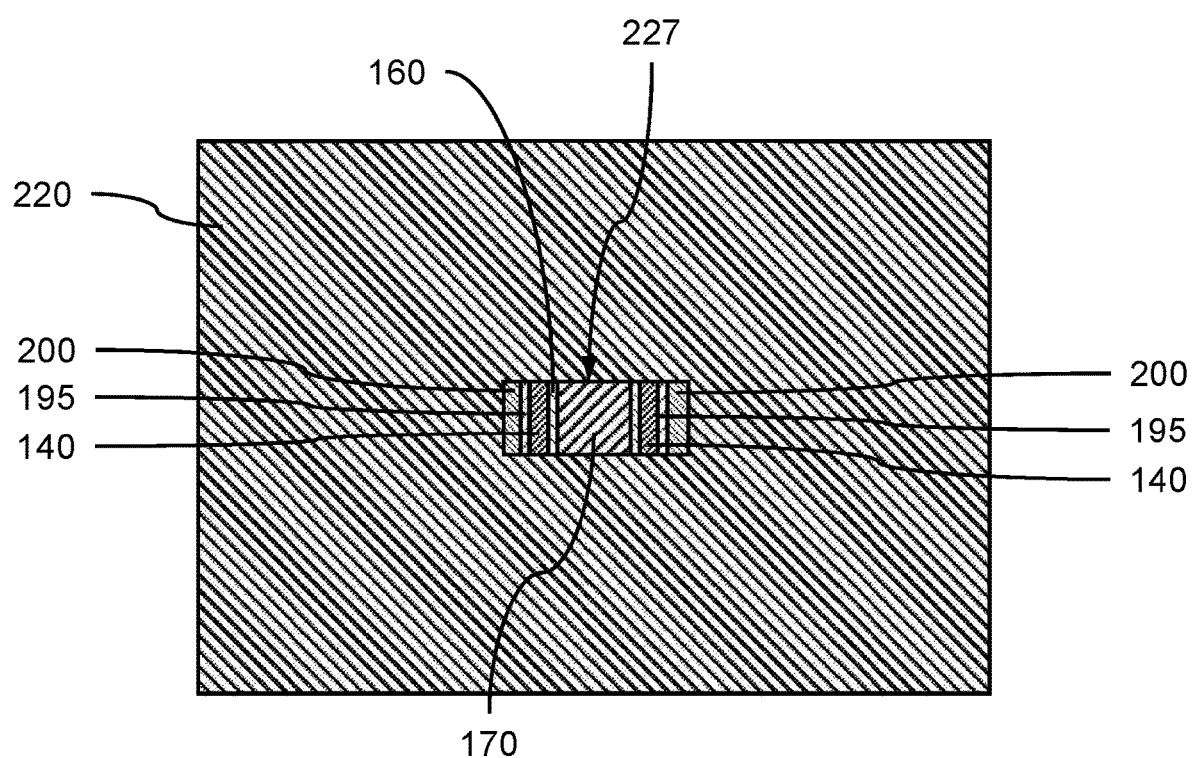
FIG. 14 is a top view showing the source/drain trenches filled with a second upper mask layer, and the upper and lower mask layers patterned to form a gate contact trench above a gate cap and gate liner, in accordance with an embodiment of the present invention.

FIG. 14 is a top view showing the source/drain trenches filled with a second upper mask layer, and the upper and lower mask layers patterned to form a gate contact trench above a gate cap and gate liner, in accordance with an embodiment of the present invention.

In one or more embodiments, the source/drain trenches 222 can be filled with additional lithographic material, such as organic planarization layer (OPL), and the upper mask layer 220 and lower mask layer 210 can be further patterned and removed to form gate trenches 227 over portions of the gate caps 170 and gate liners 160.

In various embodiments, the gate trenches 227 may be different sizes or may shift, so that different portions of the gate spacers 140, gate caps 170, and gate liners 160 may be exposed by each of the gate trenches 227. The gate trenches 227 can be off-set from the source/drain trenches 222.

Figure 15:
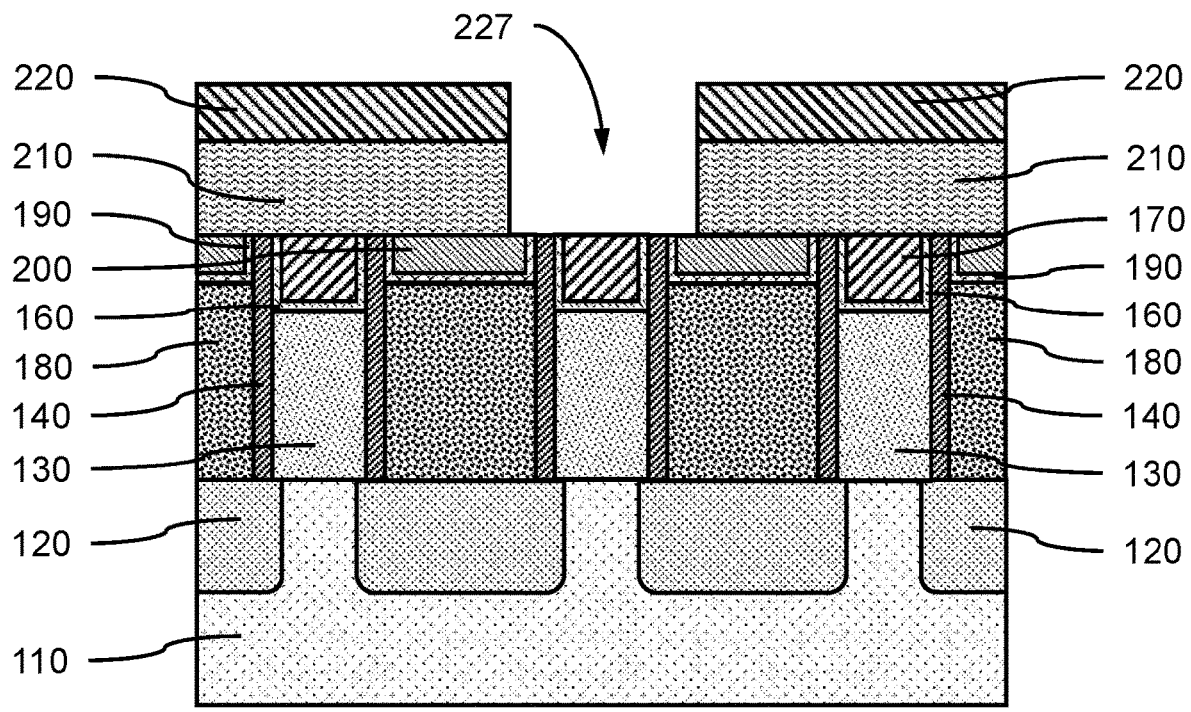
FIG. 15 is a cross-sectional side view showing the exposed gate cap, gate liner, gate spacer, and portions of the source/drain cap and source/drain liner exposed by the gate contact trench, in accordance with an embodiment of the present invention.

FIG. 15 is a cross-sectional side view showing the exposed gate cap, gate liner, gate spacer, and portions of the source/drain cap and source/drain liner exposed by the gate contact trench, in accordance with an embodiment of the present invention.

In one or more embodiments, the upper and lower mask layers can be patterned and removed using a directional etch to expose the underlying portion of the gate caps 170, as well as portions of the gate liner 160 and gate spacers 140. In a various embodiments, the gate cap removal process is selective to the gate liners 160 and source/drain cap 190.

Figure 16:
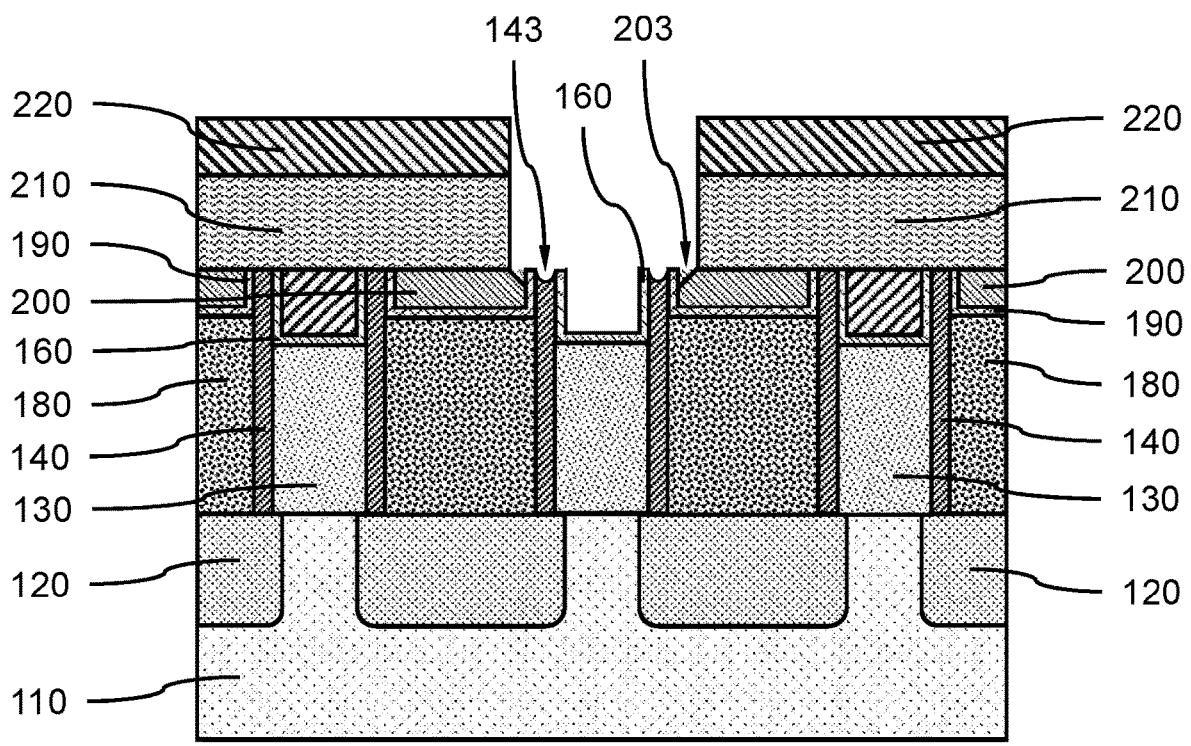
FIG. 16 is a cross-sectional side view showing a portion of the exposed gate cap and portions of the source/drain caps removed to expose a portion of the gate liner, in accordance with an embodiment of the present invention.

FIG. 16 is a cross-sectional side view showing a portion of the exposed gate cap and portions of the source/drain caps removed to expose a portion of the gate liner, in accordance with an embodiment of the present invention.

In one or more embodiments, a selective etch can be used to remove the exposed portions of the gate caps 170 to expose the underlying portion of the gate liner 160.

Figure 17:
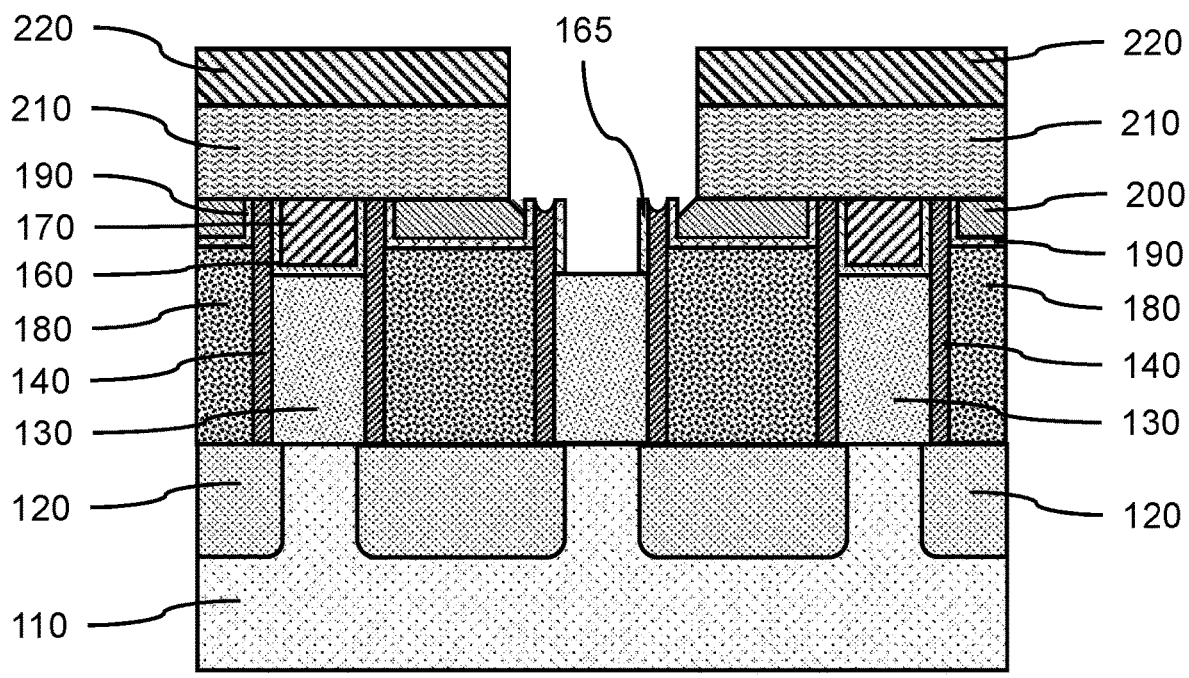
FIG. 17 is a cross-sectional side view showing the exposed portion of the gate liner removed to form a gate collar within the gate trough and expose a portion of the gate electrode, in accordance with an embodiment of the present invention.

FIG. 17 is a cross-sectional side view showing the exposed portion of the gate liner removed to form a gate collar within the gate trough and expose a portion of the gate electrode, in accordance with an embodiment of the present invention.

In one or more embodiments, a portion of the gate liners 160 on the gate electrodes 130 can be removed using a selective, directional etch (e.g., RIE) to expose the top surface of the gate electrode 130, and leave a gate buffer 165 on each of the sidewalls of the opposite gate spacers 140. The endwalls of the gate liners 160 may not be exposed by the gate trenches 227, so that portion of the gate liners 160 may not be etched.

In one or more embodiments, a portion of the gate liners 160 on the gate electrodes 130 can be removed using a selective, isotropic etch (e.g., wet etch ultra dilute hydrofluoric acid (HF), or dry plasma $SF_6$) to remove all of the exposed gate liners 160.

Figure 18:
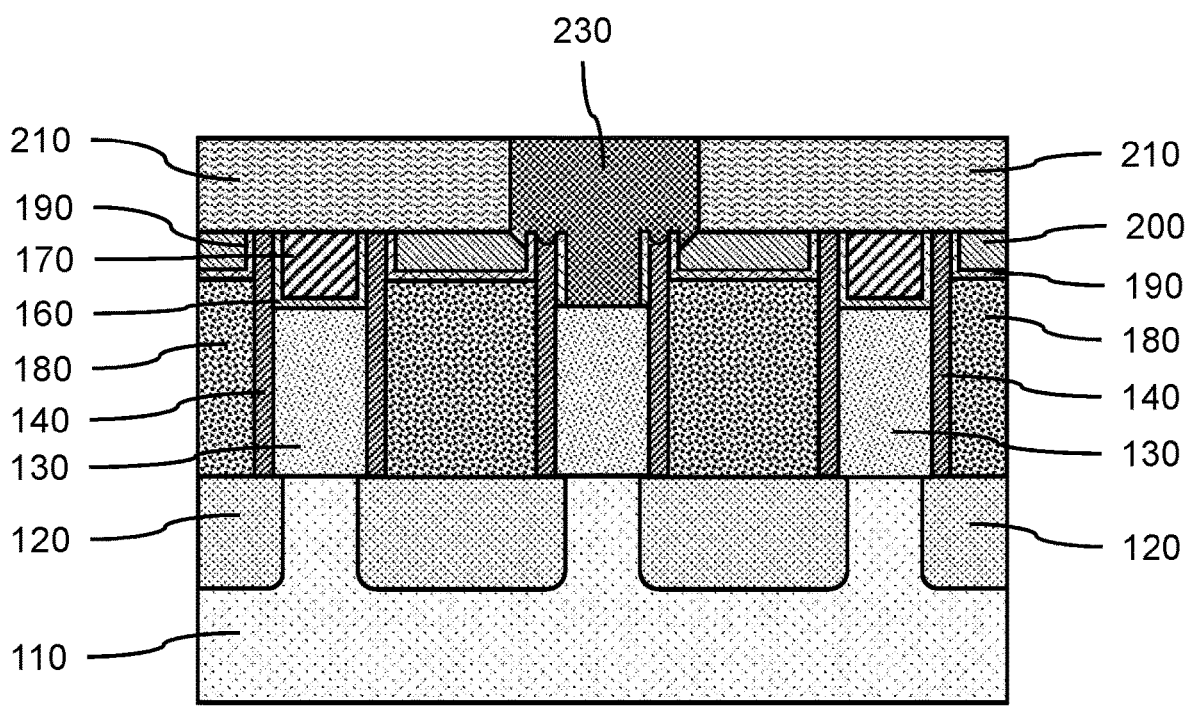
FIG. 18 is a cross-sectional side view through the A-A cross-section of FIG. 20 showing a gate contact formed in the gate trench on the expose a portion of the gate electrode, in accordance with an embodiment of the present invention.
Figure 20:
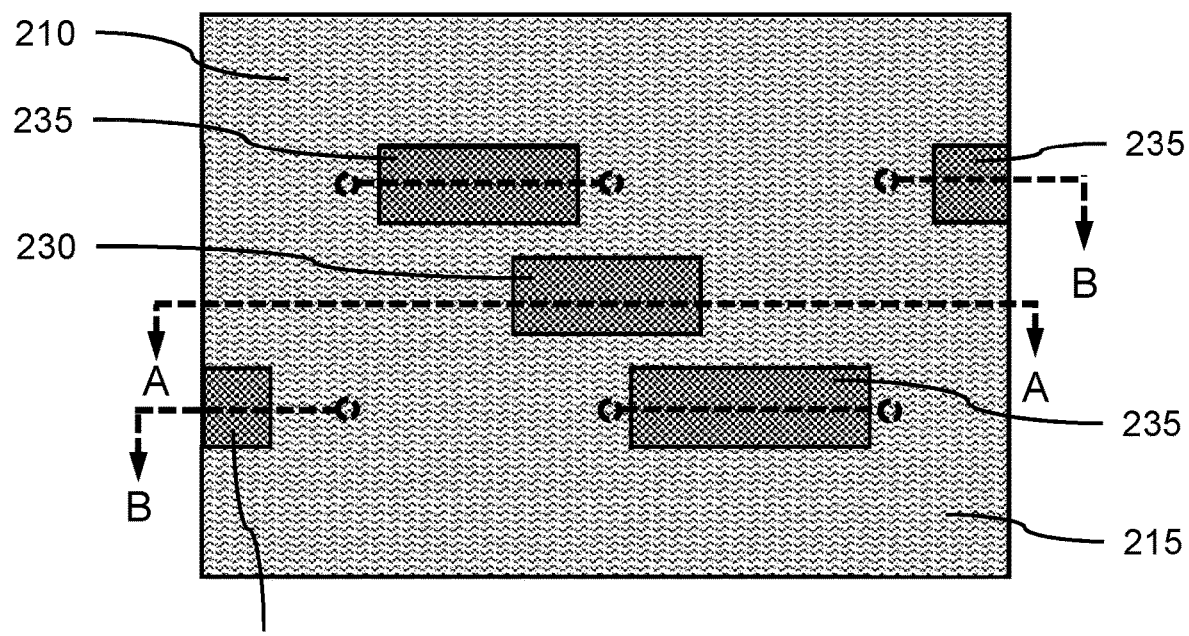
FIG. 20 is a top view showing the staggered arrangement of the source/drain leads and gate contact, in accordance with an embodiment of the present invention.

FIG. 18 is a cross-sectional side view through the A-A cross-section of FIG. 20 showing a gate contact formed in the gate trench on the expose a portion of the gate electrode, in accordance with an embodiment of the present invention.

In one or more embodiments, the upper mask layer 220 can be removed and the source/drain trenches 222 reopened using a selective etch.

In one or more embodiments, the source/drain trenches 222 and gate trenches 227 can be filled with a conductive material at the same time. A gate contact 230 can be formed in each of the gate trenches 227 on the expose a portion of the gate electrode 130.

Figure 19:
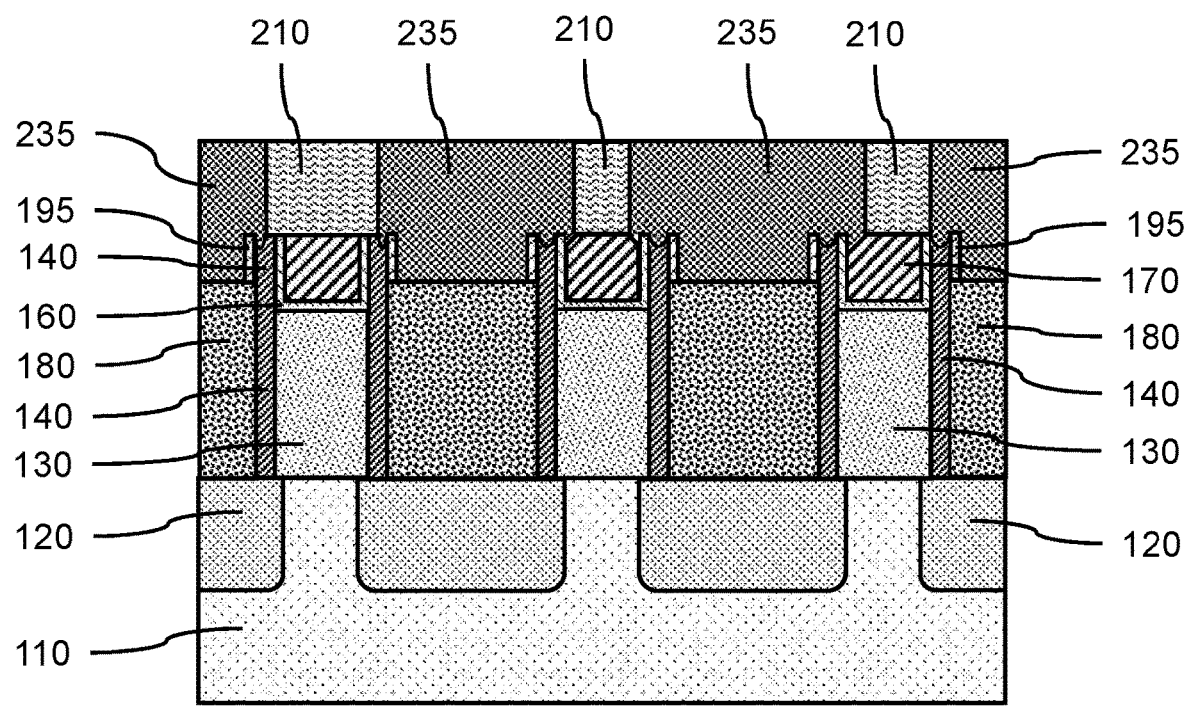
FIG. 19 is a cross-sectional side view through the staggered B-B cross-section of FIG. 20 showing source/drain leads formed in each of the source/drain trenches on the expose a portion of the conductive source/drain contacts, in accordance with an embodiment of the present invention.

FIG. 19 is a cross-sectional side view through the staggered B-B cross-section of FIG. 20 showing source/drain leads formed in each of the source/drain trenches on the expose a portion of the conductive source/drain contacts, in accordance with an embodiment of the present invention.

In one or more embodiments, a source/drain lead 235 can be formed in each of the source/drain trenches 222 on the expose a portion of the conductive source/drain contacts 180.

In various embodiments, the gate contacts 230 and source/drain leads 235 can be a conductive metal, including, but not limited to, tungsten (W), aluminum (Al), copper (Cu), cobalt (Co), nickel (Ni), titanium (Ti), ruthenium (Ru), molybdenum (Mo), or any other suitable conductive material. The contact can further include a barrier layer. The barrier layer can be titanium nitride (TiN), tantalum nitride (TaN), hafnium nitride (HfN), niobium nitride (NbN), tungsten nitride (WN), tungsten carbon nitride (WCN), or combinations thereof, where the barrier layer can prevent diffusion and/or alloying of the metal contact fill material with the top source drain material, and/or anode/cathode material. In various embodiments, the barrier layer can be deposited in the trench(es) by ALD, CVD, MOCVD, PECVD, or combinations thereof. In various embodiments, the metal fill can be formed by ALD, CVD, and/or PVD to form the electrical contacts.

FIG. 20 is a top view showing the staggered arrangement of the source/drain leads and gate contact, in accordance with an embodiment of the present invention.

In one or more embodiments, placement of the gate contacts 230 and source/drain leads 235 can be above the active devices, where the positions of the source/drain leads 235 can be offset from the positions of the gate contacts 230 and each other to maximize the dielctric material between the conductive material to avoid electrical shorts.

In various embodiments, portions of the gate liners 160 can remain in regions of the gate troughs 135 outside of the gate trenches 227, and portions of the source/drain liner 190 can remain in regions of the source/drain troughs 185 outside of the source/drain trenches 222. The separate liners 160, 190 can be around the bottom surface and sidewalls of the gate cap 170 and source/drain cap 200 in regions outside of the gate trenches 227 and source/drain trenches 222, respectively, to improve the Gate Contact Over Active (CGOA) margin and self-aligned contacts (SAC). Even with mask misalignments, the combination of gate liners 160 and gate caps 170, and source/drain liners 190 and source/drain caps 200, can protect the gate spacers 140 and conductive source/drain contacts 180. The avoidance of excessive etching of the gate caps 170 and source/drain caps 200 can improve device reliability by reducing electrical shorts between the source/drain and gate structures.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A transistor device, comprising:
   at least three active gate structures with each active gate structure including a gate spacer and a gate electrode on a substrate;
   a source/drain contact between each adjacent pair of the at least three active gate structures;
   a gate contact on each of the gate electrodes, wherein at least a portion of the gate contact is on a portion of a source/drain cap; and
   a source/drain lead on each of the source/drain contacts, wherein a portion of the source/drain lead is on a portion of the gate spacer.

2. The transistor device of claim 1, wherein source/drains are in the substrate, and each of the source/drain contacts is on and in electrical contact with one of the source/drains.

3. The transistor device of claim 2, further comprising a gate liner and a gate cap on a portion of each gate electrode.

4. The transistor device of claim 3, further comprising a gate buffer between a portion of the gate spacer and gate contact for each of the at least three active gate structures.

5. The transistor device of claim 4, further comprising a source/drain liner on a portion of each of the source/drain contacts.

6. The transistor device of claim 5, further comprising a source/drain buffer on a portion of each of opposing sidewalls of adjacent gate spacers.

7. The transistor device of claim 6, wherein the source/drain leads are offset from the positions of the gate contacts.

8. The transistor device of claim 7, wherein the source/drain liners are a metal oxide selected from the group consisting of aluminum oxide (AlO), hafnium oxide (HfO), zirconium oxide (ZrO), titanium oxide (TiO), tantalum oxide (TaO), niobium oxide (NbO), and combinations thereof.

9. The transistor device of claim 8, wherein the gate liners are a metal oxide selected from the group consisting of aluminum oxide (AlO), hafnium oxide (HfO), zirconium oxide (ZrO), titanium oxide (TiO), tantalum oxide (TaO), niobium oxide (NbO), and combinations thereof, and the gate liners are a different metal oxide from the source/drain liners.

10. The transistor device of claim 9, wherein the source/drain caps are a hardmask material selected from the group consisting of silicon nitride (SiN), silicon oxynitride (SiON), silicon carbide (SiC), silicon carbonitride (SiCN), silicon boronitride (SiBN), silicon borocarbide (SiBC), silicon boro carbonitride (SiBCN), and combinations thereof, and the gate caps are a different hardmask material from the source/drain caps.

11. The transistor device of claim 10, wherein the gate spacers are a silicon based dielectric material selected from the group consisting of silicon oxy boro carbon nitride (SiOBCN), silicon oxy carbo nitride (SiOCN), silicon boro carbonitride (SIBCN), silicon carbonitride (SiCN), and combinations thereof.

12. A transistor device, comprising:
   at least three active gate structures with each active gate structure including a gate spacer and a gate electrode on a substrate;
   a source/drain contact between each adjacent pair of the at least three active gate structures;
   a gate contact on each of the gate electrodes, wherein at least a portion of the gate contact is on a portion of a source/drain cap;
   a gate buffer between a portion of the gate spacer and gate contact for each of the at least three active gate structures; and
   a source/drain lead on each of the source/drain contacts, wherein a portion of the source/drain lead is on a portion of the gate spacer.

13. The transistor device of claim 12, further comprising a source/drain liner on a portion of each of the source/drain contacts, wherein the gate buffer and the source/drain liner are on opposite sides of each gate spacer.

14. The transistor device of claim 13, wherein the source/drain leads are offset from the positions of the gate contacts.

15. The transistor device of claim 14, wherein the gate spacer of each of the at least three active gate structures is between an adjacent source/drain contact and gate electrode.

16. A transistor device, comprising:
   at least three active gate structures with each active gate structure including a gate spacer and a gate electrode on a substrate;
   a source/drain contact between each adjacent pair of the at least three active gate structures, wherein the gate spacer of each of the at least three active gate structures is between an adjacent source/drain contact and gate electrode;
   a gate contact on each of the gate electrodes; and
   a source/drain lead on each of the source/drain contacts, wherein the gate contact and source/drain leads are staggered.

17. The transistor device of claim 16, further comprising a source/drain liner on a portion of each source/drain contact, and a source/drain cap on each source/drain liner.

18. The transistor device of claim 17, further comprising a portion of a lower mask layer between each of the source/drain leads and gate contacts.

19. The transistor device of claim 18, wherein a gate buffer is between a portion of at least one gate contact and adjacent gate spacer.

20. The transistor device of claim 19, further comprising a source/drain buffer on each of the sidewalls of adjacent gate spacers.

* * * * *